United States Patent [19]
Pakeriasamy

[11] Patent Number: 5,957,293
[45] Date of Patent: Sep. 28, 1999

[54] TRAY TO SHIP CERAMIC SUBSTRATES AND CERAMIC BGA PACKAGES

[75] Inventor: Saragarvani Pakeriasamy, San Jose, Calif.

[73] Assignee: Advanced Micro Devices, Inc., Sunnyvale, Calif.

[21] Appl. No.: 09/072,006

[22] Filed: May 4, 1998

[51] Int. Cl.⁶ .................................................. B65D 73/02
[52] U.S. Cl. ........................... 206/725; 206/565; 206/815
[58] Field of Search .................................. 206/719, 722, 206/725, 564, 565, 815

[56] References Cited

U.S. PATENT DOCUMENTS

| | | | |
|---|---|---|---|
| 5,131,535 | 7/1992 | O'Connor et al. | 206/722 |
| 5,203,452 | 4/1993 | Small et al. | 206/725 |
| 5,310,076 | 5/1994 | Burton et al. | 206/719 |
| 5,400,904 | 3/1995 | Maston, III et al. | 206/725 |
| 5,418,692 | 5/1995 | Nemoto | 206/722 |
| 5,450,959 | 9/1995 | Philippi | 206/725 |
| 5,547,082 | 8/1996 | Royer et al. | 206/722 |
| 5,577,610 | 11/1996 | Okuda et al. | 206/722 |
| 5,772,038 | 6/1998 | Murata et al. | 206/725 |
| 5,791,486 | 8/1998 | Brahmbhatt | 206/725 |
| 5,794,784 | 8/1998 | Murphy | 206/725 |
| 5,848,703 | 12/1998 | Murphy et al. | 206/725 |

*Primary Examiner*—Paul T. Sewell
*Assistant Examiner*—J. Mohandesi
*Attorney, Agent, or Firm*—Davis Chin

[57] ABSTRACT

A dual-purpose carrier tray is specially adapted for packing and shipping either a plurality of ceramic substrates and/or ceramic BGA packages. The carrier tray includes a tray member having a plurality of pockets disposed therein for packing and storing the plurality of ceramic substrates and/or ceramic BGA packages. Semicircularly depressed support members are provided to support only the lower surface adjacent corresponding corners of the plurality of ceramic substrates and/or ceramic BGA packages. A plurality of stand-offs are provided for contactly engaging only the top surface of the plurality of substrates and/or BGA packages adjacent its corners in a lower tray member when stacked so as to retain firmly the substrates and/or BGA packages in the pockets.

7 Claims, 3 Drawing Sheets

TRAY TO SHIP CERAMIC SUBSTRATES AND CERAMIC BGA PACKAGES

This invention relates generally to packaging systems for semiconductor integrated circuit devices. More particularly, it relates to a novel dual-purpose tray of a unique configuration for packing and shipping of a plurality of ceramic substrates and/or ceramic ball grid array (BGA) packages.

In view of the trend for higher and higher packing densities for semiconductor integrated circuit devices, there has developed in recent years by electronic manufacturers extremely miniaturized rectangular plate-shaped parts of the type having no terminal leads, such as pin grid array packages. Some of these types of pin grid array package structures are formed with solder balls on their bottom surface rather than with external terminal pins and are referred to as "ball grid arrays" (BGA) packages.

One particular type of BGA package that has specific applications involving high I/O capabilities and high-performance, thermal and electrical characteristics is sometimes referred to as "ceramic BGA" packages. For example, a typical ceramic BGA package having four hundred and eighty-four solder balls on its bottom surface may have length and width dimensions of about 38 mm and a thickness of about 2 mm.

During the manufacturing of the ceramic BGA packages, these packages are stored in and transported to and from various types of processes or manufacturing equipment for carrying out different manufacturing and assembling steps. For instance, the ceramic BGA packages may be assembled, marked, tested, inspected, and the like during which time the packages are handled and transported between the various manufacturing processes and/or machines. Further, after the processing steps have been completed the ceramic BGA packages are also packed and transported from a chip manufacturer's site to an assembly station at a customer's site where additional assembly operations are performed.

Due to the fact that these ceramic BGA packages are susceptible not only to possible physical damage during the handling and shipping but as well as to destruction caused by electrostatic discharge (ESD), the container or carrier must be able to render a certain degree of protection for the sensitive ceramic BGA packages to be transported therein. Heretofore, there is known in the prior art of a chip carrier tray having a plurality of separate compartments or pockets for holding a number of individual BGA packages spaced apart from each other. Such a conventional chip carrier tray 110 is illustrated in FIG. 10 and is labeled "Prior Art." The chip carrier tray 110 includes a plurality of corresponding pockets 112 each being capable of housing a single BGA package 114 therein. Since the solder balls formed on the bottom surface of the BGA package 114 are generally in contact with the top surface of the pockets 112, this conventional carrier tray 110 suffers from the disadvantage of the build-up of electrostatic charges due to contact between the package and the tray. Further, another tray is typically placed on top of the bottom tray during shipping. However, there are generally spaces or gaps formed between the trays when they are stacked. As a result, the BGA packages may be dislodged from the pockets of the tray when subjected to mechanical shock and vibration.

Therefore, it would be desirable to provide an improved dual-purpose carrier tray for packing and/or shipping of a plurality of ceramic substrates and/or ceramic BGA packages during the various steps of manufacturing and/or assembly and subsequent shipping to a customer's site. Further, it would be expedient to provide such a dual-purpose carrier tray which can be made relatively inexpensively and which is compatible for use with other manufacturing processes and/or equipment for subsequent production operations.

SUMMARY OF THE INVENTION

Accordingly, it is a general object of the present invention to provide an improved dual-purpose carrier tray of a generally rectangular construction which is relatively simple and economical to manufacture and assemble, but yet overcomes the disadvantages of the prior art BGA tray.

It is an object of the present invention to provide a novel dual-purpose carrier tray for packing and shipping of a plurality of ceramic substrates and/or ceramic BGA packages which reduces packing costs and simplifies the loading and packing process.

It is another object of the present invention to provide an improved dual-purpose carrier tray for effectively and efficiently packing and shipping of a plurality of ceramic substrates and/or ceramic BGA packages so as to facilitate their handling and transportation during the various steps of manufacturing and/or assembly and subsequent shipping to a customer's site.

It is still another object of the present invention to provide an improved dual-purpose carrier tray for packing and shipping of a plurality of ceramic substrates and/or ceramic BGA packages which includes a tray member having a plurality of pockets and semicircularly depressed support members formed adjacent the upper free corners of the pockets for supporting only the lower surface adjacent corresponding corners of the plurality of ceramic substrates and/or ceramic BGA packages.

It is yet still another object of the present invention to provide an improved dual-purpose carrier tray for packing and shipping of a plurality of ceramic substrates and/or ceramic BGA packages which is made of a relatively inexpensive material and of a simple construction, but yet is relatively durable and re-usable.

In accordance with these aims and objectives, the present invention is concerned with the provision of a dual-purpose carrier tray for packing and shipping of a plurality of ceramic substrates and/or ceramic BGA packages which includes a rectangularly-shaped tray member formed of narrow raised lip portions and a recessed portion surrounded on each side by the lip portions. The recessed portion includes a plurality of pockets disposed therein for packing and storing the plurality of ceramic substrates and/or ceramic BGA packages.

Each of the plurality of pockets is formed of a bottom wall, opposed side walls, and opposed end walls all joined integrally together to the edges of the bottom wall and extend vertically therefrom so as to form a central cavity portion. Support members are disposed adjacent the upper free corners formed by the opposed side walls and opposed end walls of the pocket for supporting only the lower surface adjacent corresponding corners of the plurality of ceramic substrates and/or ceramic BGA packages. Spacer members are disposed on the lower surface of the bottom wall of the pocket for contactly engaging only the top surface of the plurality of ceramic substrates and/or ceramic BGA packages adjacent its corners in a lower tray member when stacked so as to retain firmly the ceramic substrates and/or ceramic BGA packages in the pockets.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
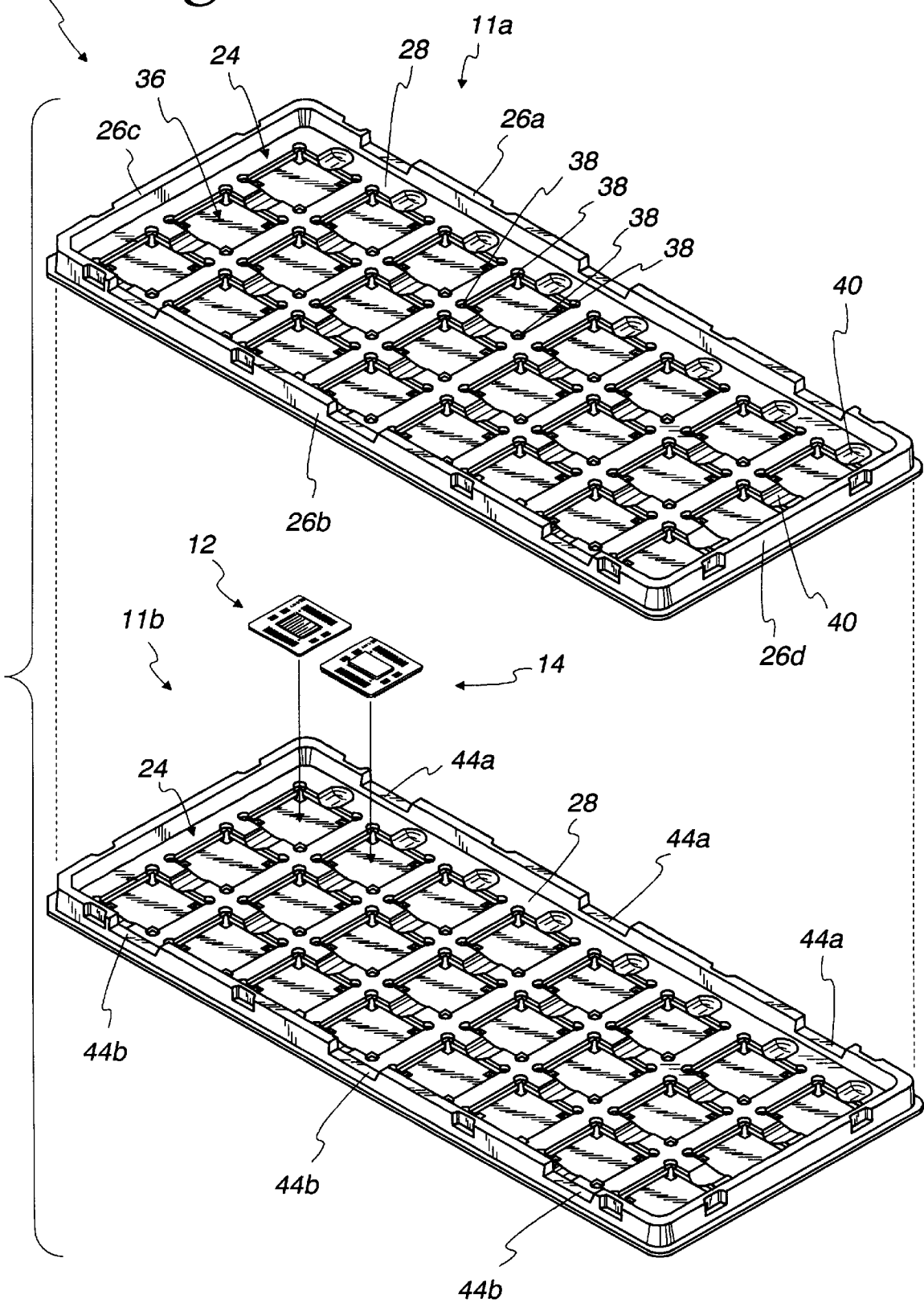
FIG. 1 is an exploded, perspective view of a dual-purpose carrier tray, constructed in accordance with the principles of the present invention.

Referring now in detail to the drawings, there is shown in FIG. 1 a novel dual-purpose carrier tray designated generally by reference number 10 and constructed in accordance with the principles of the present invention. In use, a plurality of such identical carrier trays 10 are adapted for especially packing and shipping of a plurality of ceramic substrates 12 and/or ceramic ball grid array (BGA) packages 14. The plurality of carrier trays 10 are then stacked on top of each other so that the upper surface of each tray, except for the top one, serves as a carrier tray member and the bottom surface of the top tray member serves as a cover member. The details of one of the tray members 11 are illustrated in FIGS. 2 through 7.

Figure 8:
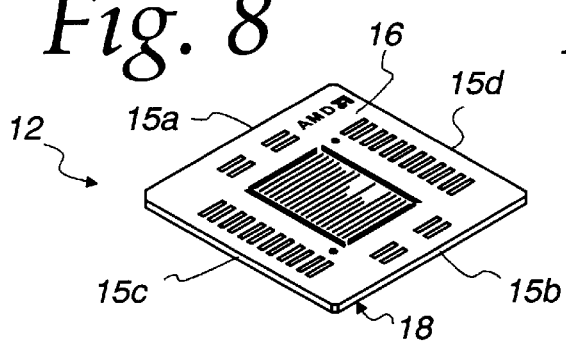
FIG. 8 is a perspective view of a ceramic substrate.
Figure 9:
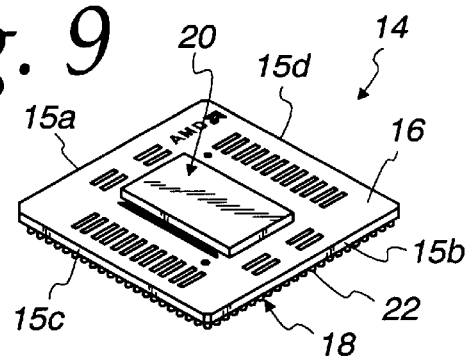
FIG. 9 is a perspective view of a ceramic BGA package.
Figure 5:
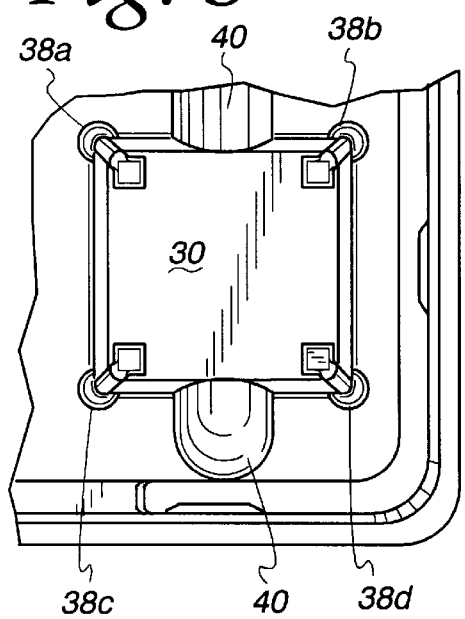
FIG. 5 is an enlarged, top view of a pocket of the carrier tray of FIG. 2.
Figure 6:
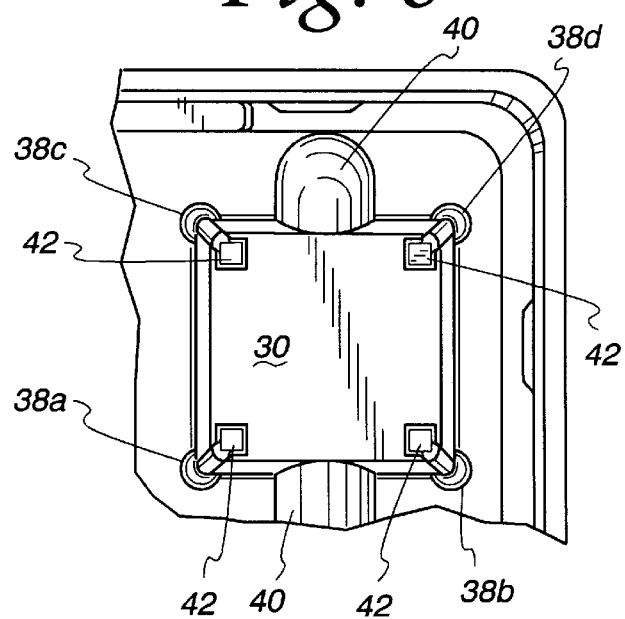
FIG. 6 is an enlarged, bottom view of the pocket of the tray member of FIG. 5.

Each of the ceramic substrates 12 (one of which is illustrated in detail in FIG. 8) is of a substantially square shape having side edges 15a–15d, a top surface 16, and a bottom surface 18. The ceramic substrate of this type is then subjected to different manufacturing or assembling steps, such as the mounting of a semiconductor chip or die onto its top surface and the soldering of solder balls onto its bottom surface thereof. Similarly, each of the ceramic BGA packages 14 (one of which is illustrated in detail in FIG. 9) is identical to the ceramic substrate 12 of FIG. 8 and further includes the addition of a semiconductor chip or die 20 mounted centrally on the top surface 16 of the ceramic substrate and a plurality of solder balls 22 provided on the bottom surface 18 thereof and arranged in a matrix configuration. The BGA package 14 may be similar to the type commercial available from Advanced Micro Devices, Inc. of Sunnyvale, Calif. In this particular case, the BGA package 14 has 484 solder balls 22 formed on its bottom surface 18.

With reference to FIGS. 1 and 2 through 7, each of the dual-purpose carrier tray members 11 is of a substantially rectangularly-shaped configuration and has a width dimension of approximately 5.35 inches and a length dimension of approximately 12.70 inches. The tray member 11 is formed of a plurality of compartments or pockets 24 which are arranged in a matrix of rows and columns. For example, the pockets 24 may be arranged into three rows and eight columns so as to pack or store twenty-four ceramic substrates 12 and/or BGA packages 14 therein. The dual-purpose tray member 11 is of a unitary construction and is preferably formed of a suitable plastic material such as polyethylene or polycarbonate which may be fabricated by a conventional injection molding process. In addition, it should be appreciate by those skilled in the art that the plastic material can be formed with an appropriate additive so as to render it anti-static or static dissipative as may be required. Further, it should be noted that the width and length dimensions of the tray member 11 can be varied in order to have a different number of pockets 24 so as to store a predetermined quantity of substrates or BGA packages therein.

Figure 4:
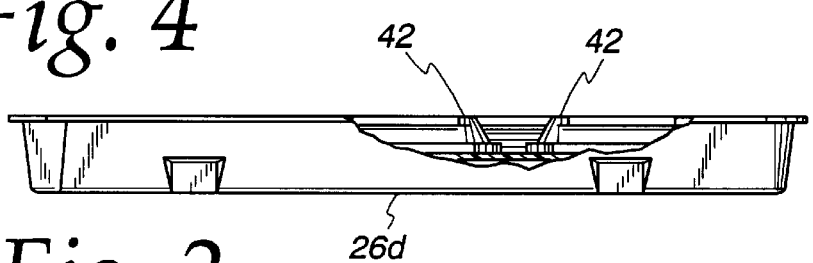
FIG. 4 is an end view, taken along the lines 4—4 of FIG. 2.
Figure 2:
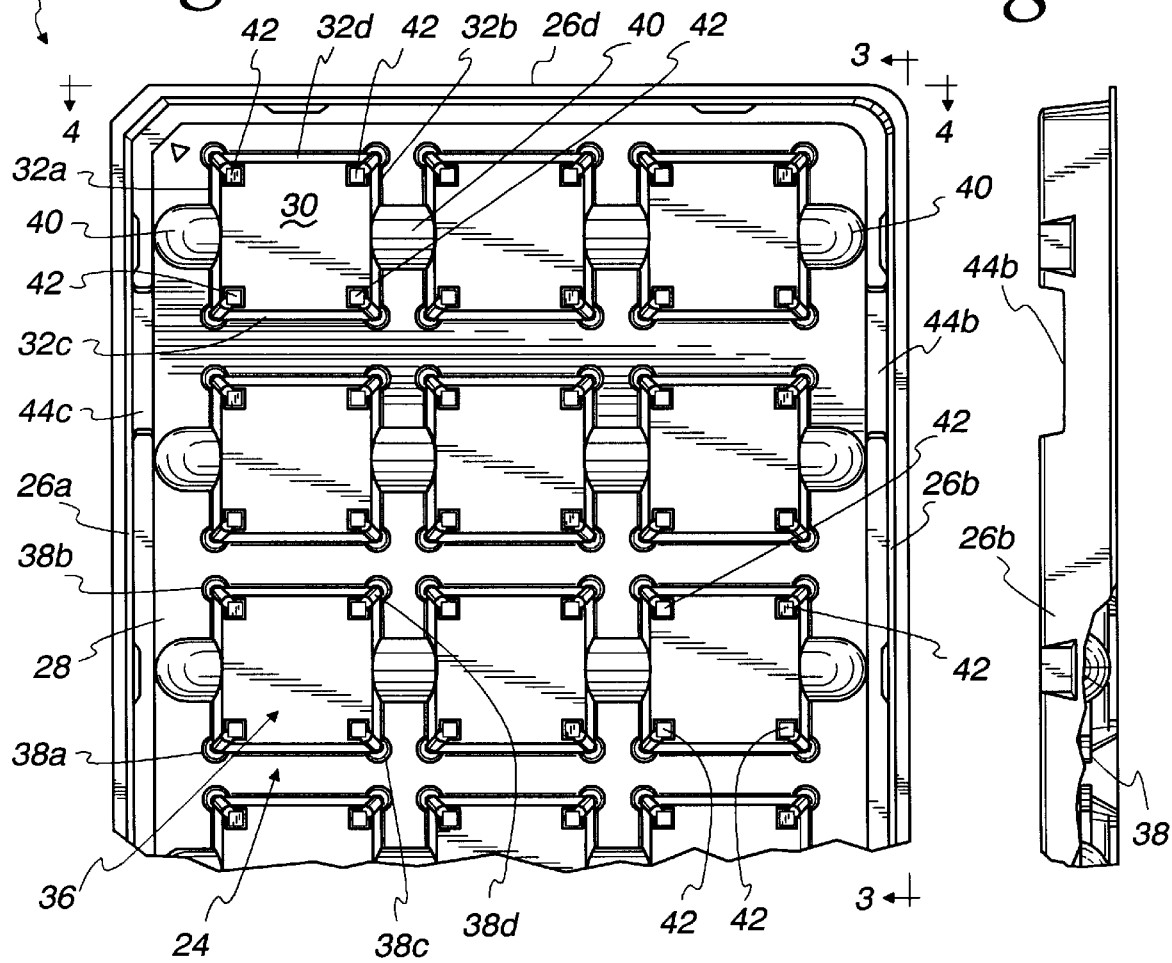
FIG. 2 is a top plan view of the carrier tray of FIG. 1.
Figure 3:
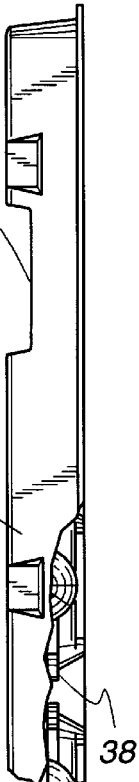
FIG. 3 is a side elevational view, taken along the lines 3—3 of FIG. 2.

As can be seen from FIGS. 2–4, the tray member 10 includes narrow raised lip portions 26a–26d and a recessed portion 28 surrounded on each side by the lip portions 26a–26d. The plurality of pockets 24 are formed in the recessed portion 28. Since all of the pockets 24 are identical in their construction, it will be sufficient to describe in detail only one of them. Each of the pockets 24 is of a generally square shape and has width and length dimensions of about 1.46 inches.

Each of the pockets 24 consists of a bottom wall 30, opposed side walls 32a and 32b, and opposed end walls 32c and 32d. The side walls and end walls 32a–32d are joined integrally to the edges of the bottom wall 30 and extend vertically therefrom so as to form a central cavity portion 36. Each of the side walls and end walls 32a–32d has a height of about 0.15 inches. There are provided semicircularly depressed support members 38a–38d disposed adjacent the upper free corners formed by the side walls and end walls of the pocket.

The opposed side walls 32a and 32b have formed along its intermediate area finger-receiving troughs 40 which allow for fingers to lift up the ceramic substrates or BGA packages so that they can be picked up and removed from the pockets 24. Further, a plurality of stand-offs or legs 42 are formed on the lower surface of the bottom wall 30 adjacent each of the corners. The stand-offs 42 in conjunction with the depressed support members 38a–38d serve to retain and hold firmly the substrate or packages when the tray members 11 are stacked so as to prevent them from being displaced from the pockets 24 when the tray members 11 are subjected to mechanical shock and vibration.

Unlike the prior art carrier tray, this feature of the present invention provides an improved retention mechanism so as to reduce potential damage to the semiconductor devices. This is due to the fact that the substrates 12 or BGA packages 14 are trapped or sandwiched between the plurality of stand-offs 42 of an upper tray member and the semicircularly depressed corner support members 38a–38d of a lower tray member when stacked so as to retain firmly the substrates or BGA packages in the pockets 24. It should be noted that the stand-offs 42 contactly engages only the top surface of the substrates or BGA packages adjacent its four corners. Further, the stand-offs 42 provide a clearance area 43 between the lower surface of the bottom wall 30 of the pocket 24 on an upper tray member and the top surface of the die of the BGA package disposed in the pocket on a lower tray member, thereby eliminating physical contact of the die with any surface of the tray member.

Figure 7:
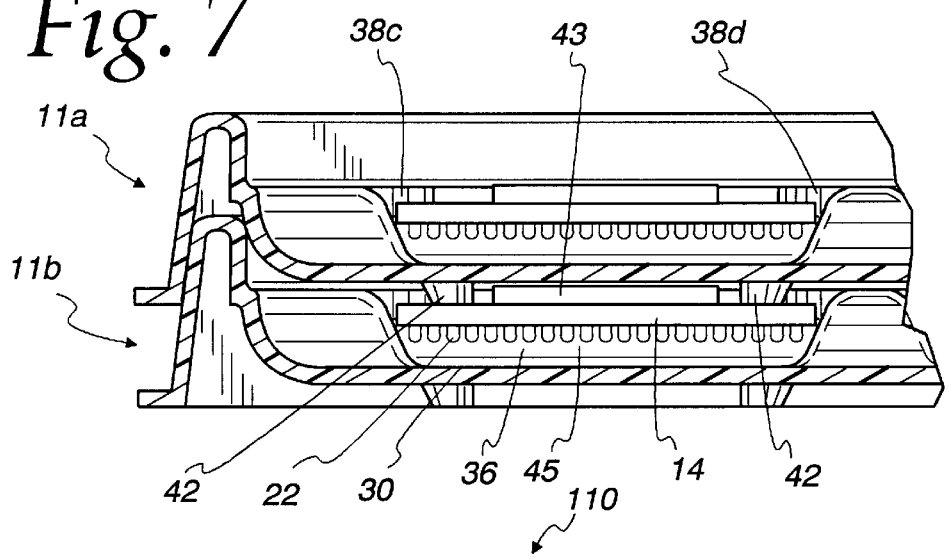
FIG. 7 is a cross-sectional view, illustrating the stacking of two pockets of two carrier trays.
Figure 10:
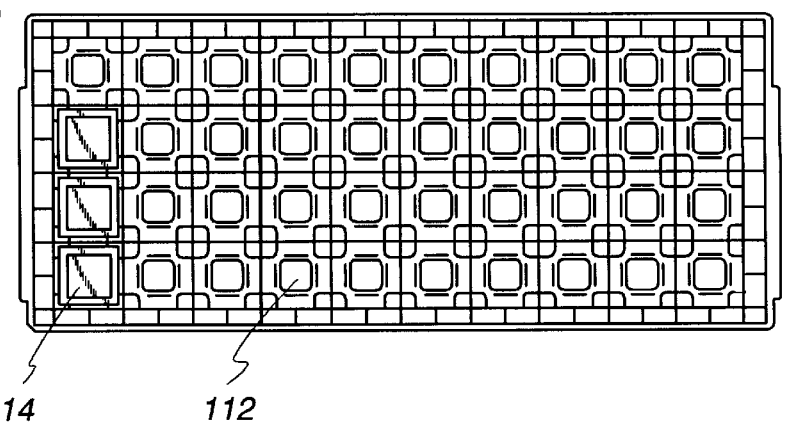
FIG. 10 is a perspective view of a conventional chip carrier tray of the prior art.

In this manner, as illustrated in FIG. 7, when the BGA packages 14 are disposed in the individual pockets 24 of the tray member 11 and then stacked on top of each other only the lower surface adjacent the four corners of the BGA package are being supported by means of the semicircularly depressed corner support members 38a–38d so that the solder balls 22 on the bottom surface of the BGA package are suspended freely above the bottom wall 30 creating a gap 45. As a result, the solder balls 22 are substantially aligned over the central cavity portion 36 and the BGA package has only minimal contact or physical engagement with any portion of the pocket 24. Thus, this serves to reduce the possibility of physical damage to the sensitive parts on the bottom surface of the BGA packages.

Securement-receiving means consisting of a plurality of aligned U-shaped slots 44a and 44b are formed on the respective lip portions 26a and 26b of the tray member. In this instance, there are provided three slots 44a disposed in the lip portion 26a which are aligned with the corresponding slots 44b in the lip portion 26b. The slots 44a, 44b are designed so as to receive a tying or strapping means (not shown) such as a rubber band, tie-wrap, strap and the like to firmly grip without slipping so as to band together the tray members 11 after they are stacked.

In use, a predetermined number of either ceramic substrates or ceramic BGA packages or a combination of the two are loaded or packed into the pockets of the trays so as to completely fill the same. As used herein, the term "dual-purpose" refers to the fact that both ceramic substrates and ceramic BGA packages can be packed and shipped in the same tray member (2-in-1). As illustrated in FIG. 1, another or second tray member 11a can be stacked on top of the first or bottom tray 11. It should be understood that any number of tray members may be stacked on top of each other as desired in which the uppermost tray member will be empty and functions as a cover member. Thereafter, the strapping means can be joined around the stacked tray members through the aligned slots 44a, 44b formed in the lip portions 26a, 26b.

The stacked tray members filled with semiconductor devices may now be suitably transported from the BGA package manufacturer's site to an assembly station at a customer's site where further assembly operations can be performed. At the customer's site, the strapping means around the stacked tray members can be removed and the tray members can be individually separated so as to allow access to the BGA packages. Therefore, the overall assembly operation has been greatly simplified and the packaging costs of the BGA packages has been significantly reduced. It should also be appreciated by those skilled in the art that the tray members, after they have been completely unloaded at the customer's site, can be re-used since they are made of a durable plastic material.

From the foregoing detailed description, it can thus be seen that the present invention provides a novel dual-purpose carrier tray for packing and shipping of a plurality of ceramic substrates and/or ceramic BGA packages. The carrier tray of the present invention includes a tray member having a plurality of pockets disposed therein for packing and storing the plurality of ceramic substrates and/or ceramic BGA packages. Semicircularly depressed support members are disposed adjacent the upper free corners of the pocket for supporting only the lower surface adjacent corresponding corners of the plurality of ceramic substrates and/or ceramic BGA packages. Further, a plurality of stand-offs are disposed on the lower surface of a bottom wall of the pocket for contactly engaging only the top surface of the plurality of substrates or BGA packages adjacent its corners in a lower tray member when stacked so as to retain firmly the substrate or BGA packages in the pocket.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. A dual-purpose carrier tray for packing and shipping of a plurality of ceramic substrates and/or ceramic BGA packages, said carrier tray comprising:

a rectangularly-shaped tray member being formed of narrow raised lip portions and a recessed portion surrounded on each side by said lip portions;

said recessed portion having a plurality of pockets disposed therein for packing and storing the plurality of ceramic substrates and/or ceramic BGA packages;

each of said plurality of pockets being formed of a bottom wall, opposed side walls, and opposed end walls all joined integrally together to the edges of said bottom wall and extending vertically therefrom so as to form a central cavity portion;

semicircularly depressed corner member support members disposed adjacent the upper free corners formed by said opposed side walls and said opposed end walls of said plurality of pockets for supporting only the lower surface adjacent corresponding corners of said plurality of ceramic substrates and/or ceramic BGA packages; and said semicircularly depressed corner support members supporting said plurality of ceramic substrates and/or ceramic BGA packages so that the bottom surfaces thereof are suspended freely above said bottom wall of said plurality of pockets and are aligned over said central cavity portion;

a plurality of stand-offs disposed on the lower surface of said bottom wall of said pockets adjacent its corners for contactly engaging only the top surface of said plurality of substrates and/or BGA packages adjacent its corners in a lower tray member when stacked and said plurality of stand-offs providing clearance areas between the lower surface of said bottom wall of said plurality of pockets on an upper tray member and the top surface of said plurality of substrates and/or BGA packages, whereby said plurality of substrates and/or BGA packages are sandwiched between said plurality of stand-offs of an upper tray member and said semicircularly depressed corner support members of a lower tray member when stacked so as to retain firmly said substrates and/or BGA packages in said pockets.

2. A dual-purpose carrier tray as claimed in claim 1, wherein said tray member is formed of a plastic material.

3. A dual-purpose carrier tray as claimed in claim 2, wherein said tray member is formed of polyethylene.

4. A dual-purpose carrier tray as claimed in claim 2, wherein said tray member is formed of polycarbonate.

5. A dual-purpose carrier tray as claimed in claim 1, wherein said tray member has a width dimension of approximately 5.35 inches and a length dimension of approximately 12.70 inches.

6. A dual-purpose carrier tray as claimed in claim 1, further comprising finger-receiving means formed on said opposed side walls of said pockets for facilitating lifting of said substrates and/or BGA packages from said pockets.

7. A dual-purpose carrier tray as claimed in claim 1, further comprising securement-receiving means formed on said lip portions of said tray member for banding together said tray members after they are stacked.

* * * * *